(12) United States Patent
Branchetti

(10) Patent No.: US 10,993,303 B2
(45) Date of Patent: Apr. 27, 2021

(54) POWER SUPPLY CIRCUIT, LIGHTING SYSTEM, AND METHOD OF OPERATING A POWER SUPPLY CIRCUIT

(71) Applicant: OSRAM GmbH, Munich (DE)

(72) Inventor: Filippo Branchetti, Munich (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 16/753,352

(22) PCT Filed: Oct. 5, 2017

(86) PCT No.: PCT/EP2017/075325
§ 371 (c)(1),
(2) Date: Apr. 3, 2020

(87) PCT Pub. No.: WO2019/068327
PCT Pub. Date: Apr. 11, 2019

(65) Prior Publication Data
US 2020/0323064 A1     Oct. 8, 2020

(51) Int. Cl.
*H05B 45/10* (2020.01)
*H05B 45/375* (2020.01)
(Continued)

(52) U.S. Cl.
CPC ..... *H05B 45/375* (2020.01); *G01R 19/16538* (2013.01); *G01R 31/40* (2013.01); *H05B 45/355* (2020.01)

(58) Field of Classification Search
CPC ........ H05B 45/10; H05B 45/20; H05B 45/37; H05B 45/40; H05B 45/24; H05B 45/355;
(Continued)

(56) References Cited

U.S. PATENT DOCUMENTS 9,215,768 B2 * 12/2015 Van Der Veen ....... H05B 45/10
10,368,407 B2 * 7/2019 Luccato ................. H05B 47/11
(Continued)

FOREIGN PATENT DOCUMENTS

| CN | 101340762 A | 1/2009 |
|---|---|---|
| EP | 2557670 A2 | 2/2013 |
| KR | 101540219 B1 | 7/2015 |

OTHER PUBLICATIONS

International search report issued for the corresponding PCT application No. PCT/EP2017/075325, dated Jun. 29, 2018, 16 pages (for informational purposes only).

*Primary Examiner* — Haissa Philogene
(74) *Attorney, Agent, or Firm* — Viering, Jentschura & Partner MBB

(57) ABSTRACT

A power supply circuit may include at least a first and a second current generator. Each current generator is implemented with an electronic converter comprising a switching stage, a current sensor generating a feedback signal, and a regulator circuit configured to drive the switching stage as a function of the feedback signal. Specifically, each current sensor is a low-side current sensor configured to generate a feedback signal indicative of the current received via the negative terminal of the respective current generator. The power supply circuit may include also include a control circuit configured for various tasks pertaining to the first and second generators.

11 Claims, 9 Drawing Sheets

(51) Int. Cl.
 *G01R 31/40* (2020.01)
 *G01R 19/165* (2006.01)
 *H05B 45/355* (2020.01)
(58) Field of Classification Search
 CPC ............... H05B 45/375; H02M 3/156; H02M 3/33523; H02M 3/33553; G01R 31/40; G01R 19/16538
 See application file for complete search history.

(56) References Cited

U.S. PATENT DOCUMENTS

| | | |
|---|---|---|
| 10,485,063 B2* | 11/2019 | Ugliano ................. H05B 45/37 |
| 2013/0026825 A1 | 1/2013 | Savage et al. |
| 2015/0035447 A1 | 2/2015 | Kamoi et al. |

* cited by examiner

POWER SUPPLY CIRCUIT, LIGHTING SYSTEM, AND METHOD OF OPERATING A POWER SUPPLY CIRCUIT

CROSS-REFERENCE TO RELATED APPLICATION

The present application is a national stage entry according to 35 U.S.C. § 371 of PCT application No.: PCT/EP2017075325 filed on Oct. 5, 2017, which is incorporated herein by reference in its entirety and for all purposes.

TECHNICAL FIELD

The present description relates to power supply circuits, in particular for lighting systems, such as the improvement of power supply circuits comprising a plurality of current generators.

BACKGROUND

FIG. 1 shows a typical lighting system. In the example considered, the lighting system comprises a power supply circuit 10 and at least one lighting module 20 comprising one or more light sources, such as at least one LED (Light Emitting Diode) or other solid-state light sources, such as laser diodes.

For example, the power supply circuit 10 may comprise a current generator 12, i.e., the power supply circuit 10 receives at input via two terminals 100a and 100b a voltage $V_{in}$ (e.g., from the mains or a battery) and provides via a positive terminal 102a and a negative terminal 102b a regulated current $i_{out}$.

In a complementary manner, the lighting module 20 comprises a positive input terminal 200a and a negative input terminal 200b for connection to the terminals 102a and 102b of the power supply circuit 10. For example, the lighting module 20 may be connected directly or via a cable to the power supply circuit 10. Accordingly, the terminal 200a is connected to the terminal 102a and the terminal 200b is connected to the terminal 102b, and the lighting module 20 receives thus the current $i_{out}$.

As shown in FIG. 2, the lighting module 20 may be a solid-state lighting module comprising a string of solid-state light sources 22 connected (e.g., directly) in series between the terminals 200a and 200b. For example, in FIG. 2 are shown three LEDs $L_1$, $L_2$, $L_3$ that are connected directly in series between the terminals 200a and 200b. Accordingly, in the example considered, the current $i_{LED}$ flowing through le light sources 22 corresponds to the current $i_{out}$.

Often, the current generator 12 is implemented with a linear current regulator or a switched-mode electronic converter. For example, FIG. 3 shows a power supply circuit 10, wherein the current generator 12 is implemented with an electronic converter, e.g. a buck converter, i.e. a step-down converter.

Generally, an electronic converter comprises at least:
two terminals for receiving a voltage $V_{in}$ and two terminals for providing a current;
a switching stage 104 comprising one or more electronic switches and one or more inductors (and possibly one or more capacitors);
a current sensor 106 configured to detect a feedback signal FB indicative of the current provided by the switching stage; and
a regulator circuit 108 configured to generate one or more drive signals DRV for the switching stage 104 as a function of the feedback signal FB.

As described in the foregoing, the power supply circuit 10 receives at input a voltage $V_{in}$. In case this voltage is a DC voltage, e.g. provided by a battery, the switching stage 104 may be connected directly to the input terminals 100a and 100b of the power supply circuit 10. Conversely, in case the voltage $V_{in}$ is an AC voltage, e.g. provided by the mains, the switching stage 104 may be connected to the input terminals 100a and 100b of the power supply circuit 10 through a rectified circuit, e.g. comprising a bridge rectifier, and possibly a filter circuit. Moreover, generally, an additional electronic converter with Power Factor Correction (PFC) may be connected between the switching stage 104 and the input terminals 100a and 100b. In the example considered, the current generator 12, in particular the switching stage 104, receives directly the voltage $V_{in}$ in FIG. 3.

Similarly, the current $I_L$ provided by the switching stage 104 may correspond directly to the output current $i_{out}$, i.e. the two output terminals of the switching stage may be connected directly to the terminals 102a and 102b of the power supply circuit 10. However, also in this case may be used an additional filter for stabilizing the current $i_{out}$. In the example considered, the current generator 12, in particular the output of the switching stage 104, is connected directly to the terminals 102a and 102b in FIG. 3.

For example, in the basic structure of a buck converter, the switching stage 104 comprises an electronic switch SW, such as a field-effect transistor (FET), and an inductor L connected (e.g., directly) in series between the terminals 100a and 102a (positive terminals). Conversely, the terminal 102b is connected to the terminal 100b (negative terminals). A buck converter comprises moreover a diode D connected between the terminal 100b and the intermediate point between the electronic switch SW and the inductor L. Accordingly, in the example considered, the current $i_L$ flowing through the inductor L represents the current provided by the current generator 12, and thus the current $i_{out}$ provided via the terminals 102a and 102b.

Generally, various types of buck converters are known. For example, the diode D may be replaced also with a second switch. Moreover, also the position of the switch SW may change, e.g. between the anode of the diode D and the terminal 100b, which is usually called reverse buck configuration.

In the example considered, the regulator circuit 108 generates thus a drive signal DRV for the switch SW (and possibly the switch replacing the diode D).

As shown in FIGS. 4a and 4b, when the switch SW is closed (e.g., when the drive signal DRV is high), the diode D is reverse-biased and the current flowing through the inductor L increases substantially linearly. Conversely, when the switch SW is opened (e.g., when the drive signal DRV is low), the diode D is forward-biased and the current flowing through the inductor L decreases substantially linearly.

Accordingly, in order to implement a current generator 12, the regulator circuit 108 may control the current provided by the current generator 12. In particular this may be achieved by controlling the switch-on time $T_{ON}$ and switch-off time $T_{OFF}$ of the switch SW. For this purpose, the regulator circuit 108 detects via the sensor 106 the current provided by the current generator 12, e.g., the current provided by the switching stage 104. For example, in FIG. 3 is shown a shunt resistor $R_S$ connected in series with the output terminals 102a and 102b, e.g., between the terminal 102b and the anode of the diode D (i.e., the terminal 100b in the example considered). Accordingly, the resistor $R_S$ corresponds to a current sensor 106 configured to detect the current $i_{out}$. Generally, also other current sensors may be used, which are able to detect one or more signals indicative of the current $i_{out}$, e.g., two current sensors configured to detect the currents flowing through the switch SW and the diode D, respectively.

Accordingly, the one or more signals FB indicative of the current provided by the switching stage (i.e. the current provided by the current generator 12) may be provided to the regulator circuit 108, which drives the switch SW with the drive signal DRV.

Generally, the regulator circuit 108 may uses different approaches for generating the drive signal DRV for the switch SW (and possibly the further switch replacing the diode D).

For example, in various solutions the drive signal DRV for the switch SW is a Pulse Width Modulated (PWM) signal, i.e., a signal wherein the durations $T_{ON}$ and $T_{OFF}$ are variable but the switching interval $T_{SW}=T_{ON}+T_{OFF}$ is constant. For this purpose, the regulator circuit 108 may be a PI (Proportional-Integral) or PID (Proportional-Integral-Derivative) regulator configured to increase or decrease the duty cycle ($T_{ON}/T_{OFF}$) of the PWM signal DRV until the average value of the current corresponds to a reference value REF (see FIG. 4b).

Conversely, in other solutions, the regulator circuit 108 comprises a comparison circuit, wherein the regulator circuit 108 closes the switch SW (by setting the drive signal DRV to a first logic level, e.g., high) when the current reaches/falls below a lower threshold $TH_L$ and opens the switch SW (by setting the drive signal DRV to a second logic level, e.g., low) when the current reaches/exceeds an upper threshold $TH_H$. Such a comparison circuit may be implemented also with a single comparator with hysteresis. Alternatively, the comparison circuit may comprise only a single comparator, wherein:

the switch-on time $T_{ON}$ is constant and the comparator detects the lower threshold $TH_L$; or the switch-off time $T_{OFF}$ is constant and the comparator detects the upper threshold $TH_H$.

In many applications, it may be required that a plurality of lighting modules 20 have to be powered individually. For example, this may be required when the lighting modules 20 have to switched on or off separately, or generally, when the current provided to a lighting module 20 (or a group of lighting modules 20) has to be controlled individually, e.g. in order to regulate the intensity of the light emitted by the lighting module 20.

According such arrangements are particularly useful when the lighting modules 20 comprise light sources L having different characteristics. In fact, by using a plurality of lighting modules 20 comprising light sources emitting light with different spectral characteristics (i.e., colors), the color of the light emitted by all lighting modules 20 may be controlled. Accordingly, such an individual powering of the lighting modules 20 is often used in tuneable lighting systems comprising, e.g., lighting modules 20 emitting red, green and blue light, respectively, or lighting modules 20 emitting white light with at least two different color temperatures.

FIG. 5 shows in this respect a typical solution. In particular, in the example considered, the power supply circuit 10 comprises a plurality of current generators 12, such as three current generators $12_1$, $12_2$ and $12_3$, wherein each current generator 12 is configured to power at least one lighting module 20, such as a respective lighting module $20_1$, $20_2$ and $20_3$.

Accordingly, in the example considered, the power supply circuit 10 comprises for each current generator 12 respective output terminals 102a and 102b, such as output terminals $102a_1$ and $102b_1$ for the current generators $12_1$, etc. Accordingly, in the example considered, a single lighting module 20 or a plurality of lighting modules 20 (typically connected in series) may be connected between the output terminals 102a and 102b of the respective current generator 12.

Accordingly, each current generator 12 may control individually the current $i_{out}$ provided to the respective lighting module(s) 20. For example, as mentioned before, each current generator 12 may perform a dimming operation by controlling the current flowing through the respective lighting module(s) 20, e.g., by modulating the amplitude of the current $i_{out}$ and/or switching on and off the respective lighting module(s) 20, e.g., by using a pulse width modulation. Typically, the frequency of such a PWM modulation (e.g., between 100 Hz and 5 kHz) is small with respect to the switching frequency of the electronic converter (e.g., between 10 kHz and 1 MHz).

FIG. 5 shows also that the power supply unit 10 may be connected to the mains M and receive an AC voltage $V_{in}$, such as 230 VAC. As mentioned before, in this case, the power supply unit 10 may comprise a rectifier circuit 30 configured to receive at input the voltage $V_{in}$ and provide at output a rectified voltage $V_{in,DC}$. Generally, a single rectifier circuit 30 may be used for all current generators 12.

Moreover, FIG. 5 shows an optional additional electronic converter 32 (e.g., downstream the rectifier circuit 30), such as a PFC converter, configured to receive at input the voltage $V_{in}$ or the rectified voltage $V_{in,DC}$ and generate at output a regulated voltage $V_{BUS}$, which is provided at input to the current generators 12, in particularly the respective switching stages 104. For example, often the electronic converter 32 is based on a boost converter, while the current generators are based on buck converters (see also the description of FIGS. 3 and 4).

SUMMARY

The inventor has observed that the power supply circuit described with respect to FIG. 5 may damage one or more of the lighting modules connected to the power supply circuit.

One or more of the embodiments described herein provide solutions which permit to overcome such problems.

According to one or more embodiments, such object is achieved thanks to a power supply circuit having the features set forth in the claims that follow. The claims refer moreover to a corresponding lighting system and method of operating a power supply circuit.

The claims are an integral part of the technical teaching provided herein with reference to the present description.

As mentioned before, various embodiments of the present description relate to a power supply circuit. In various embodiments, the power supply circuit comprises at least two current generators, and for each current generator, a positive and a negative terminal adapted to be connected to one or more lighting modules. In various embodiments, each current generator is thus connected to a respective positive terminal and a respective negative terminal of the power supply circuit.

In various embodiments, each current generator is implemented with an electronic converter comprising a switching stage, a low-side current sensor and a regulator circuit. Specifically, the switching stage, such as a buck converter, may comprise one or more electronic switches and one or more inductors, wherein the output of the switching stage is connected to the positive and negative terminal of the respective current generator. The low-side current sensor, such as a low-side shunt resistor, is configured to generate a feedback signal indicative of the current received via the negative terminal of the respective current generator. The regulator circuit is configured to drive the one or more electronic switches of the switching stage as a function of the feedback signal of the respective current generator.

In various embodiments, the power supply circuit may also comprise two input terminals for receiving an input voltage. In this case, the power supply circuit may be configured to power the current generators via this input voltage. For example, the input voltage may be an AC voltage and the power supply circuit may comprise a rectifier circuit connected between the input terminals and the current generators. The power supply circuit may also comprise an additional electronic converter, such as a PFC boost converter, connected between the input terminals and the current generators. Accordingly, in various embodiments, the current generators are powered with the same power supply signal, e.g., corresponding to the input voltage, the rectified input voltage or the voltage at the output of the additional electronic converter.

The inventor has observed that such a power supply circuit may damage lighting modules when the lighting modules are incorrectly connected to the power supply circuit. Specifically, since each current sensor is arranged to detect the return current, i.e., the current received via the respective negative terminal, the current sensor is indeed unable to determine the current provided by the respective switching stage when the lighting modules have a cross-wiring connection. Accordingly, in this case, the respective regulator circuit operates with inconsistent feedback data.

Accordingly, in various embodiments, the power supply circuit comprises also a control circuit. Specifically, in various embodiments, the control circuit activates the first current generator and maintains deactivated the second current generator. Next, while the first current generator is activated and the second current generator is deactivated, the control circuit monitors the feedback signal (at least) of the second current generator. Accordingly, by verifying whether the feedback signal of the second current generator indicates that the current received via the respective negative terminal has reached or exceeded a given maximum threshold, the control circuit may identify the state of the first current generator with a state indicating a cross-wiring condition. In this case, the control circuit may also deactivate the first current generator. Conversely, in case the current does not reach or exceed the given maximum threshold (e.g., after a given maximum time), the control circuit may also activate the second current generator. For example, for this purpose, the control circuit may repeat the verification until:

a) the verification indicates that the current received reaches or exceeds the maximum threshold, or b) the given maximum time has lapsed since the activation of the first current generator.

In various embodiments, the control circuit may also perform other operations. For example, the control circuit may generate one or more control signals in order to perform an amplitude modulation and/or pulse width modulation of the currents generated by the current generators as a function of one or more control signal indicative of a requested luminosity and/or light color.

BRIEF DESCRIPTION OF THE DRAWINGS

Various embodiments will now be described, by way of non-limiting example only, with reference to the associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or to afford a better understanding.

DETAILED DESCRIPTION

In the following description, numerous specific details are given to provide a thorough understanding of the embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the extent of protection or meaning of the embodiments.

Figure 13:
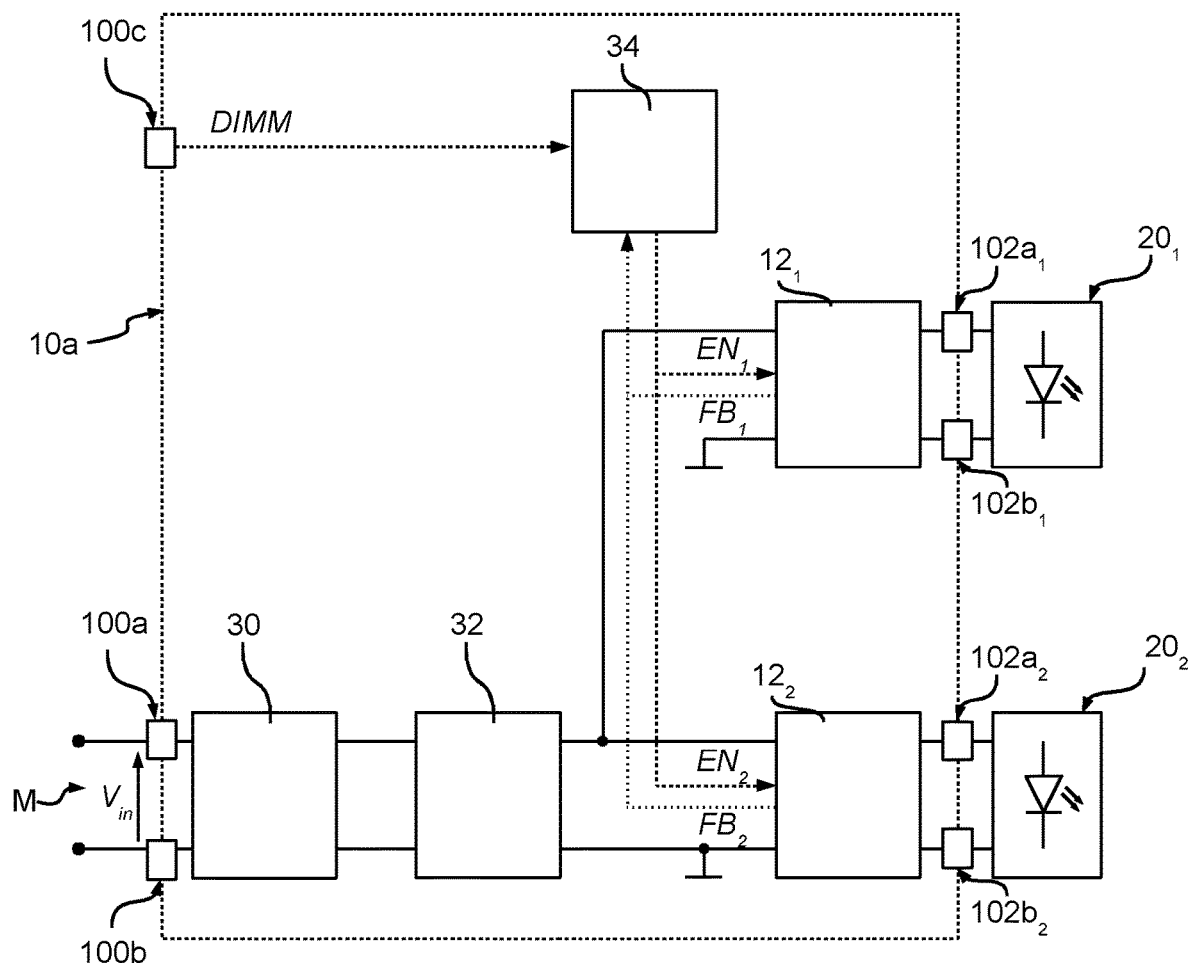
FIG. 13 shows a further embodiment of power supply circuit in accordance with the present disclosure.

In the following FIGS. 6 and 13, the parts, elements or components which have already been described with reference to FIGS. 1 to 5 are denoted with the same references previously used in such Figures; the description of such previously described elements will not be repeated, so as not to overburden the present detailed description.

Figure 5:
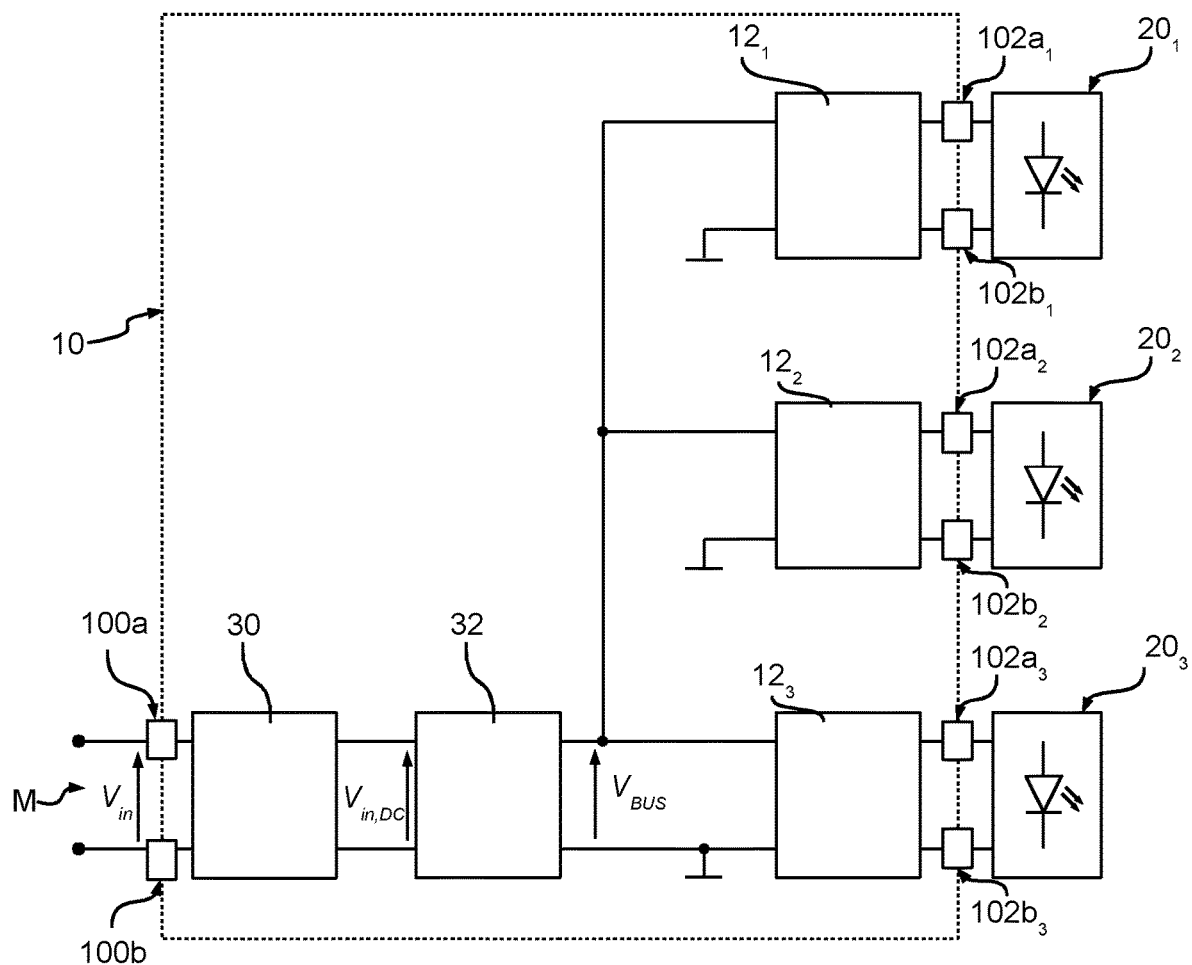
FIG. 5 shows a typical power supply circuit comprising a plurality of current generators.

As mentioned before, the inventor has observed that the power supply circuit described with respect to FIG. 5 may damage one or more of the lighting modules 20 connected to the power supply circuit 10. Specifically, the inventor has observed that such damages are not caused by a malfunction of the power supply circuit 10, but indeed an incorrect connection of the lighting modules 20 to the power supply circuit 10.

Figure 6:
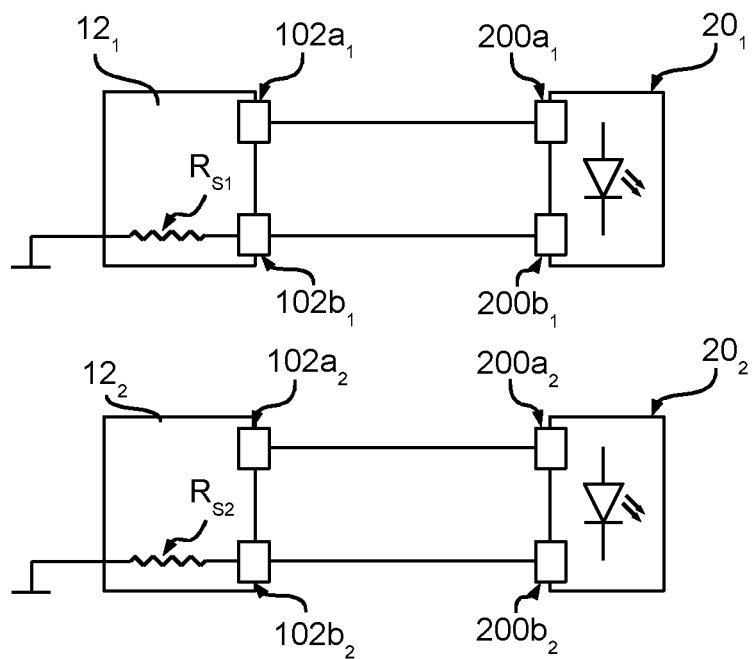
FIGS. 6 and 7 show possible connections of lighting modules to the power supply circuit of FIG. 5.

FIG. 6 shows in this respect the output stage of the power supply circuit 10 described with respect to FIG. 5. For simplicity, in FIG. 6 are only shown two current generators $12_1$ and $12_2$, but the power supply circuit 10 could comprise also more current generators 12. As described in the foregoing, the current generators 12 may be powered via the voltage $V_m$ received via the input terminals 100a and 100b of the power supply circuit 10, or the power supply circuit 10 may comprise a rectifier circuit 30 and/or an additional electronic converter 32 configured to generate a voltage $V_{in,DC}/V_{BUS}$ used to power the current generators 12. Generally, the power supply circuit 10 may also comprise input and/or output filters.

Figure 1:
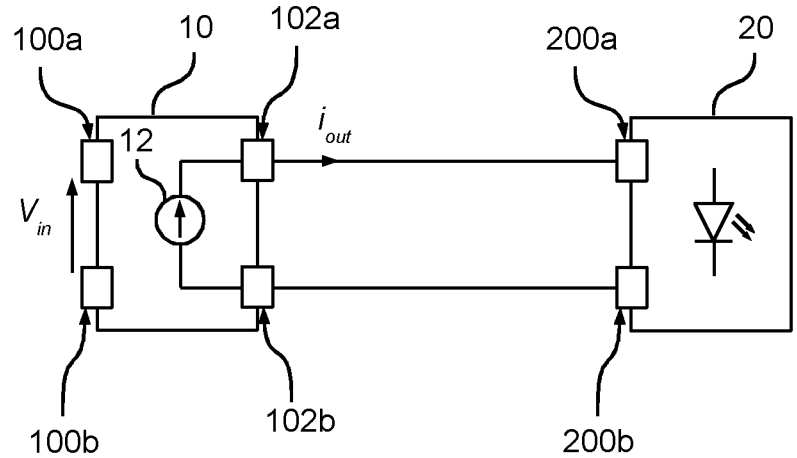
FIG. 1 shows a typical lighting system comprising a power supply circuit and a lighting module.
Figure 2:
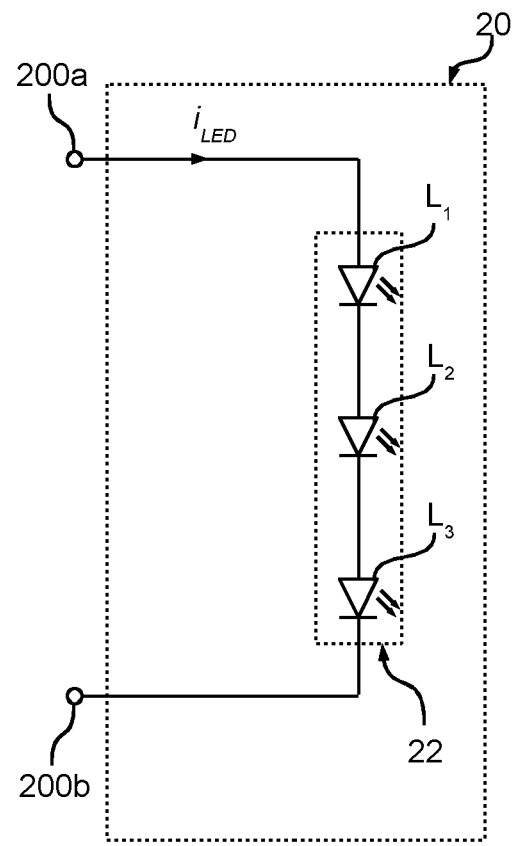
FIG. 2 shows a typical lighting module.
Figure 3:
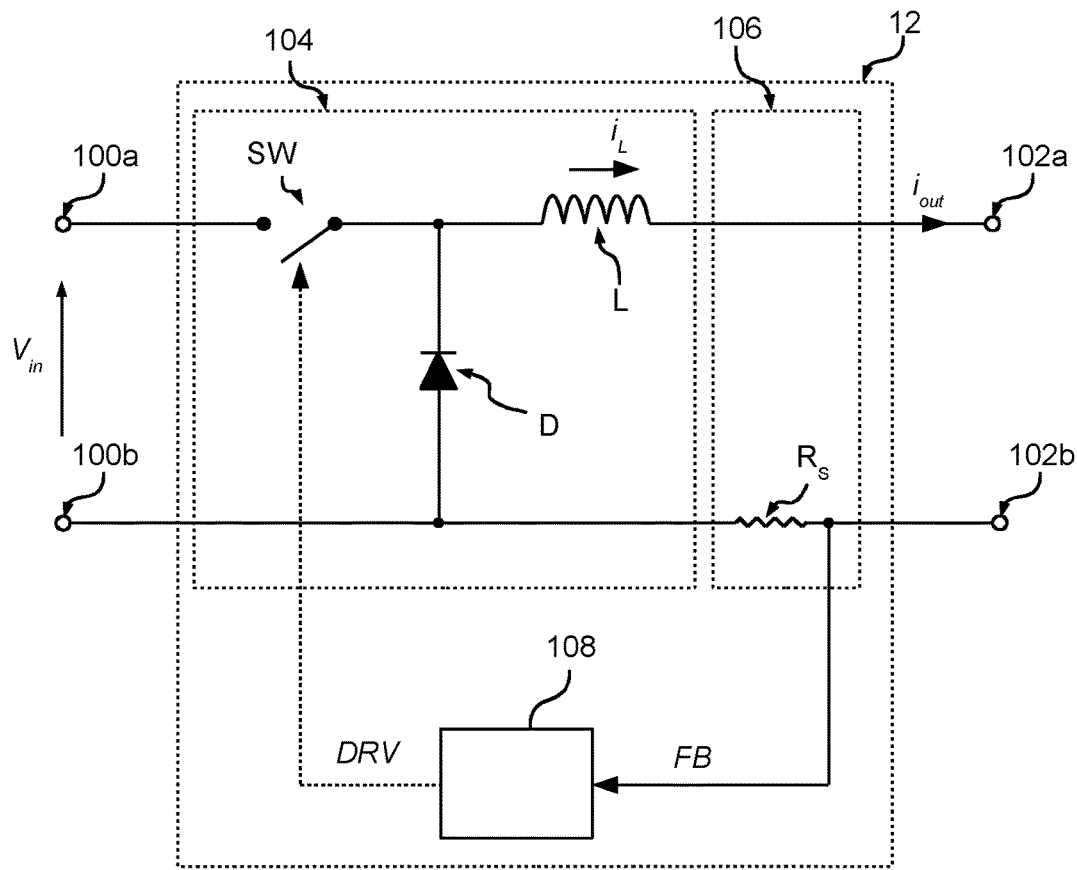
FIGS. 3 and 4 show a typical power supply circuit comprising a current generator.

As described with respect to FIG. 3, the current generators 12 are usually implemented with an electronic converter, such as a buck converter, comprising:

two terminals for receiving a DC voltage (i.e., $V_{in}$, $V_{in,DC}$ or $V_{BUS}$) and two terminals for providing the output current $i_{out}$;

a switching stage 104 powered with the DC voltage and comprising one or more electronic switches and one or more inductors (and possibly one or more capacitors);

a current sensor 106 configured to detect a feedback signal FB indicative of the output current $i_{out}$ provided by the switching stage; and a regulator circuit 108 configured to generate one or more drive signals DRV for the switching stage 104 as a function of the feedback signal FB.

Figure 4:
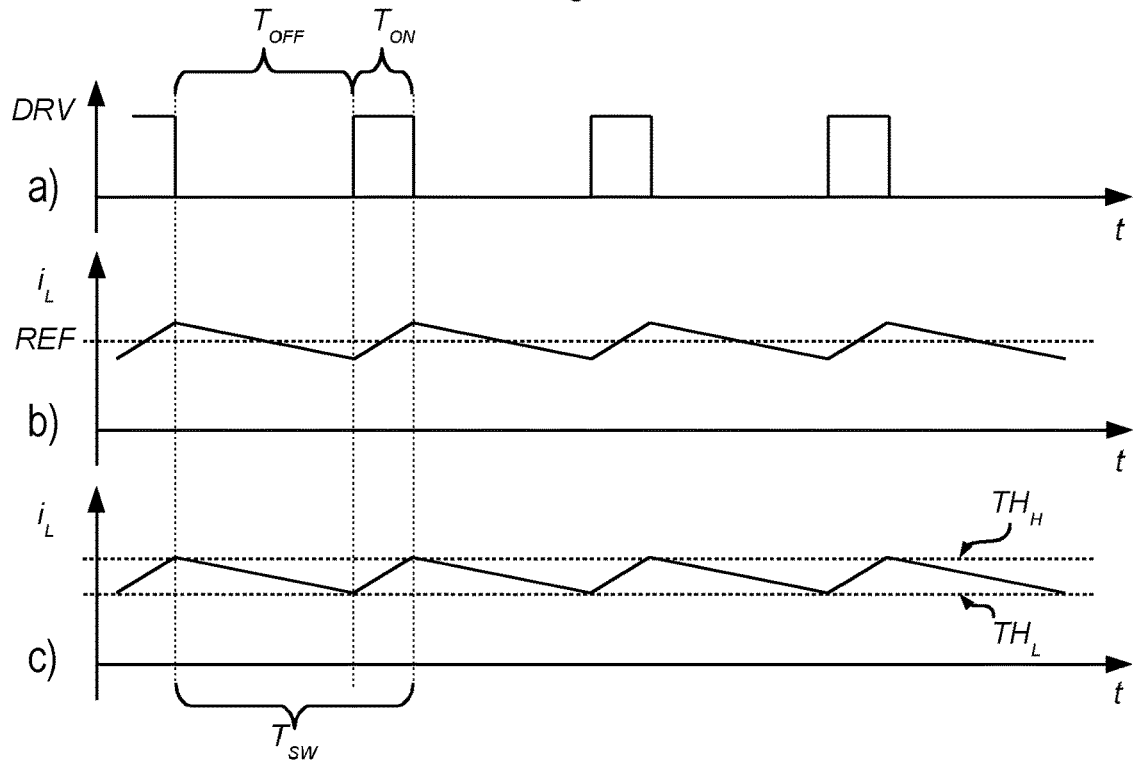

The respective description of FIGS. 3 and 4 are thus not repeated again.

Accordingly, the power supply circuit 10 comprises for each current generator 12 two respective output terminals 102a and 102b, e.g., terminals $102a_1/102b_1$ and $102a_2/102b_2$ for the embodiment considered.

Moreover, each current generator 12 is configured to regulate the output current $i_{out}$ provided via the respective output terminals 102a /102b to one or more lighting modules 20 by means of the current sensor 106 and the regulator circuit 108. For example, in FIG. 6 are shown two shunt resistors $R_{S1}$ and $R_{S2}$ for the two current generators $12_1$ and $12_2$, respectively Consequently, in the embodiment considered, the regulator circuit 108 of the first current generator $12_1$ will drive the respective switching stage 104 as a function of the feedback signal FB provided by the respective current sensor 106, e.g., the resistor $R_{S1}$. Conversely, the regulator circuit 108 of the second current generator $12_2$ will drive the respective switching stage 104 as a function of the feedback signal FB provided by the respective current sensor 106, e.g., the resistor $R_{S1}$.

Specifically, FIG. 6 shows a correct connection of two lighting modules $20_1$ and $20_2$ to the current generators $12_1$ and $12_2$, i.e., the terminals $200a_1/200b_1$ of the first lighting module 201 are connected to the terminals $102a_1/102b_1$ of the current generator $12_1$, and the terminals $200a_2/200b_2$ of the second lighting module $20_2$ are connected to the terminals $102a_2/102b_2$ of the current generator $12_2$.

Figure 7:
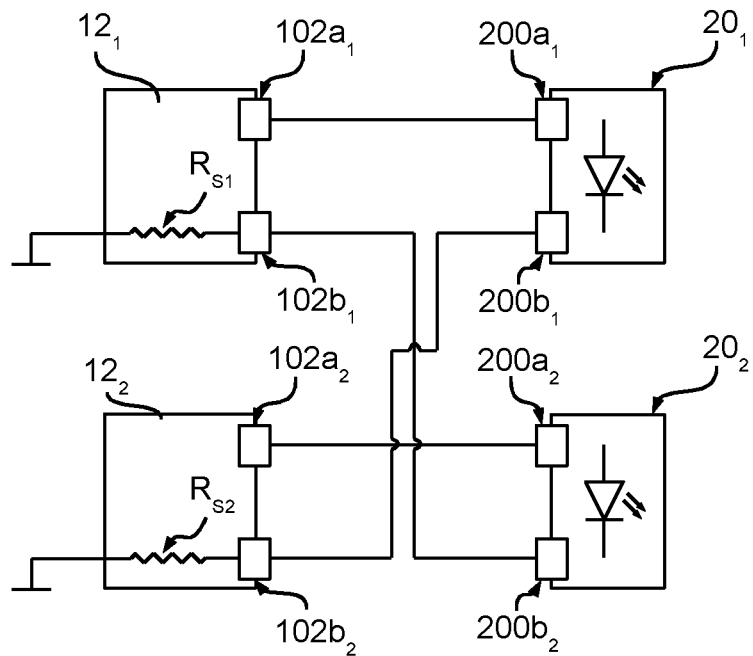

Conversely, FIG. 7 shows a scenario in which a wrong connection is used, e.g., the terminal $200b_1$ of the first lighting module $20_1$ is connected to the terminal $102b_2$ of the current generator $12_2$ and the terminal $200b_2$ of the second lighting module $20_2$ is connected to the terminal $102b_1$ of the current generator $12_1$.

However, in certain current generators 12, such an erroneous connection may cause malfunctions and even damage a lighting module 20.

For example, the inventor has observed that such damages may occur in case the current sensor 106 is configured to detect the return current, i.e., the current received via the terminal 102b, e.g., in case a low side shunt resistor $R_S$ is used (see also FIG. 3). In fact, in this case, the current sensor 106 is indeed unable to determine the current $i_{out}$ provided by the respective switching stage 104, when the lighting modules have the wrong connection.

For example, in FIG. 7, the current sensor $R_{S1}$ of the first current generator $12_1$ will at most provide a signal being indicative of the current $i_{out}$ provided by the second current generator $12_2$. Accordingly, in case the current generator $12_2$ is switched off, the regulator circuit 108 of the first current generator $12_1$ will drive the respective switching stage 104 in order to increase the output current $i_{out}$. However, a similar behavior may also occur when both current generators 12 are switched on, because the regulation feedback loop operate with inconsistent feedback data.

For example, when considering a buck converter, the regulator circuit 108 may:

increase the duty cycle of a PWM driving signal DRV to almost 100%, when the regulator circuit 108 comprises a PI or PID regulator;

increase the switch-on time and/or decrease the switch-off time, when the regulator circuit 108 comprises a comparison circuit.

Accordingly, in these situations, the current generator 12 will generate the maximum output power, which may damage the light sources of the respective lighting module 20. For example, when considering a buck converter, the output voltage at the terminals 102a/102b may thus correspond substantially to the input voltage of the switching stage 104 (which is usually significantly higher than the forward voltage of the solid-state light sources), which thus will generate a high current flow through the solid-state light sources.

A possible solution to this problem may consist in using a current sensor 106 configured to detect directly the current $i_{out}$ provided via the terminal 102a, such as a high-side shunt resistor $R_S$. However, this requires usually a differential amplifier in order to detect the voltage drop at the resistor, thereby rendering the solution more complex and increasing the cost of the system.

Moreover, the current generator 12 may also comprise a protection circuit configured to detect an abnormal operation. For example, the regulator circuit 108 may turn off the switching stage 104 after a short amount of time of maximum power output and/or when detecting that a variation of the driving signal DRV for the switching stage 104 does not result in a variation of the feedback signal. However, such a protection time may still be enough to damage or destroy the lighting module 20.

Figure 8:
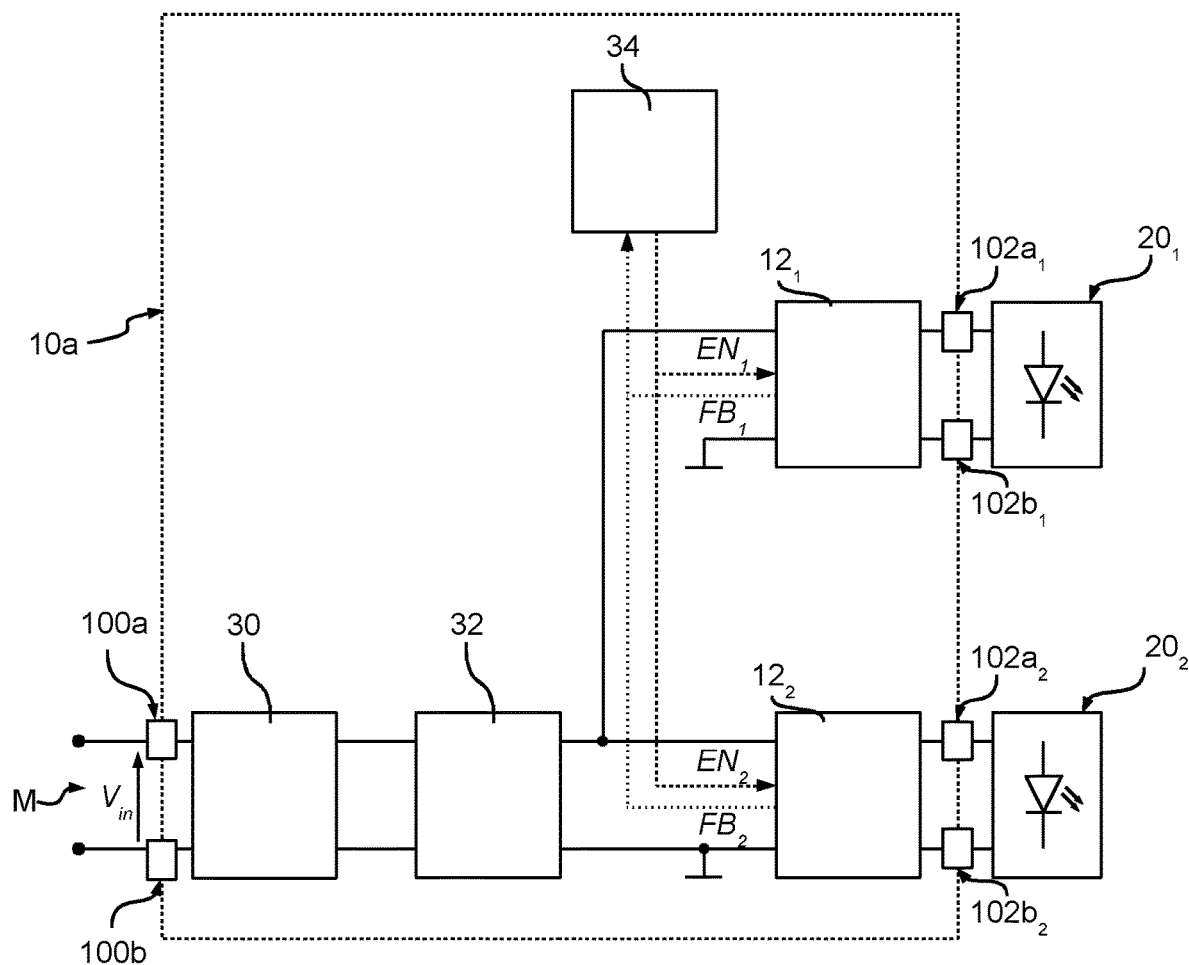
FIG. 8 shows an embodiment of power supply circuit in accordance with the present disclosure.

FIG. 8 shows an embodiment of a power supply circuit 10a configured to detect such wrong connections/cross-wiring of the lighting modules 20 and possibly deactivate one or more of the current generators 12.

Specifically, in the embodiment considered, the power supply circuit 10a comprises a control circuit 34, such as a microprocessor programmed via software instructions or any other suitable analog and/or digital circuit.

Specifically, in the embodiment considered, the control circuit 34 is configured to generate one or more control signals EN used to selectively activate or deactivate the various current generators 12 as a function of the feedback signals FB generated by the current sensors 106 of the current generators 12. For example, in the embodiment considered, the control unit 34 generates a respective control signal EN for each current generator 12.

Accordingly, in the embodiment considered, each current generator is configured to activate or deactivate the respective output current $i_{out}$ as a function of the one or more control signal EN, e.g., as a function of the respective control signal EN. For example, the one or more control signal EN may be used to enable the respective current generator 12 or deviate the output current $i_{out}$ within the current generator 12, e.g. by using a shunt switch connected between the terminals 102a and 102b.

Specifically, in various embodiments, the control unit 34 is configured to activate sequentially the current generators 12 and monitor the various feedback signals FB in order to determine whether one or more lighting modules 20 are incorrectly connected to the current generators 12. Specifically, incorrect connection means that one or more lighting modules 20 are not connected between the terminals 102a and 102b of the same current generator 12, but between the terminals 102a and 102b of two different current generators 12.

For example, the control unit 34 may determine whether the current generator by an activated current generator 12:

a) returns (at least in part) to the own negative terminal 102b by monitoring the signals FB of the activated current generator 12; and/or b) returns (at least in part) to the negative terminal 102b of a deactivated current generator 12 by monitoring the signals FB of the deactivated current generator(s); and/or c) does not return to any negative terminal 102b of the current generator 12 by monitoring the signals FB of all current generators.

Thus, while the condition c) indicates that no lighting module 20 is connected to the activated current generator 12, the condition b) indicates an incorrect connection, because at least part of the current generated by the activated current generator 12 returns to another (deactivated) current generator 12.

In general, after having verified the connection of a current generator 12, the respective current generator 12 may be deactivated or a next (previously deactivated) current generator 12 may be activated in addition to the already activated current generator(s) 12. The former solution may detect other types of erroneous connections of the lighting modules 20. Conversely, the latter may avoid a flickering of the light emitted by the lighting modules 20, which in this case are switched on only for a short period.

As mentioned before, the control unit 34 may be implemented with any suitable analog and/or digital circuit. For example, in various embodiments, the control unit 34 comprises a microprocessor programmed via software instructions. In this case, the microprocessor may have associated one or more analog-to-digital converters (ADC) in order to provide digital samples of the feedback signals FB to the microprocessor. The microprocessor may then generate the one or more signals EN as a function of the digital versions of the feedback signals FB, in particular to activate sequentially the current generators 12 and deactivate at least the current generators 12 for which an incorrect connection (see point b) or optionally an open load condition (see point c) has been detected. However, also a simple comparator may be used, which is configured to determine whether a given feedback signal FB indicates that the measured current is greater than a reference threshold. Accordingly, the complete control unit 34 may also be implemented with a conventional micro-controller.

Figure 9:
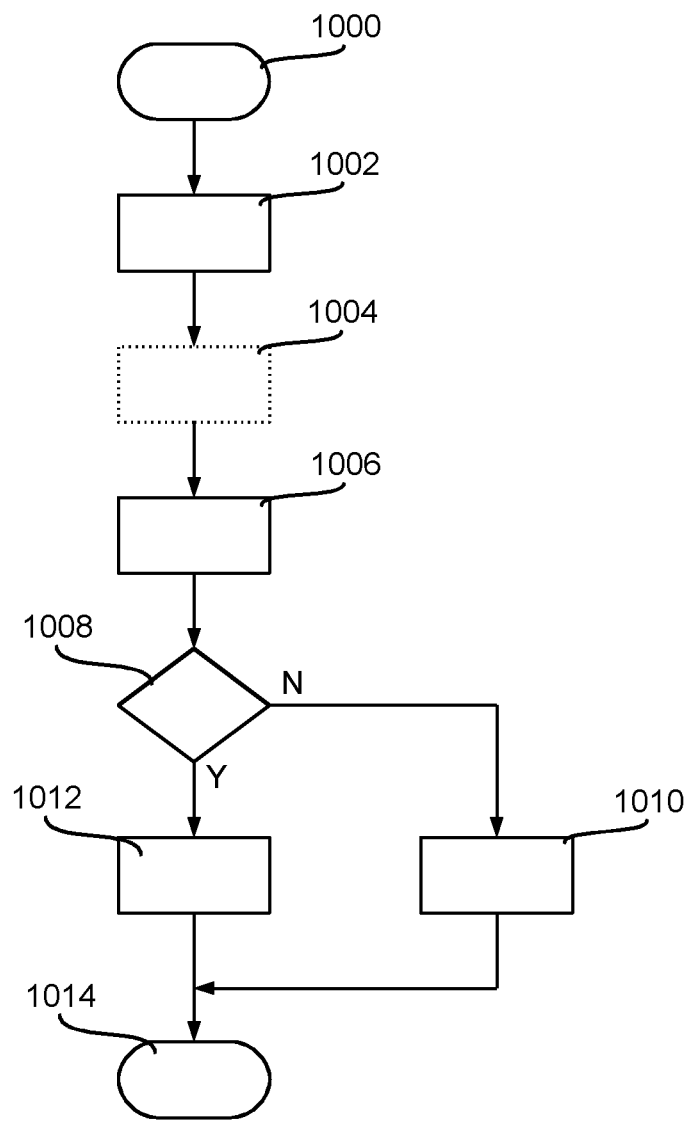
FIGS. 9, 10, 11 and 12 show embodiments of the operation of the power supply circuit of FIG. 8.

FIG. 9 shows in this respect a flowchart of an embodiment of the steps performed by the control unit 34.

Specifically, after a start step 1000, the control unit 34 activates at a step 1002 the first current generator $12_1$.

At a following step 1006, the control unit 34 monitors the feedback signals FB, i.e. the current flowing through the low side current sensors 106, at least the feedback signals FB of the current generators 12 being deactivated.

At a following verification step 1008, the control unit 34 may verify/test whether the currents monitored by the low side current sensors 106 of the deactivated current generators 12 are all substantially zero. For example, as mentioned before this verification may involve comparing the feedback signal with a reference threshold (e.g., by processing the digital samples provided by an ADC, or by using the signal provided by an analog comparator).

In case the verification indicates that the currents flowing through the low side current sensors 106 of the deactivated current generators 12 are all substantially zero (output "Y" of the verification step 1008), the control unit 34 may proceed to a step 1012, in which the state of the activated current generator 12 is set to a first state, which indicates that no cross-wiring has been detected for the activated current generator 12. Next the procedure terminates at a stop step 1014. The same procedure is then repeated for the next current generator 12 until all current generators 12 have been tested. As mentioned before, when proceeding to the next current generator, the currently activated current generator 12 may be maintained switched on, or switched off at the step 1012 based on the application needs.

Conversely, in case the verification indicates that at least one of the currents flowing through the low side current sensors 106 of the deactivated current generators 12 is greater than zero (output "N" of the verification step 1008), the control unit 34 may proceed to a step 1010, in which the state of the activated current generator 12 is set to a second state, which indicates that a cross-wiring has been detected for the activated current generator 12. Next the procedure terminates at the stop step 1014. In various embodiments, all activated current generators 12 may be deactivated at the step 1010 and the complete procedure may be interrupted.

In various embodiments, the control unit 34 may verify/test at the verification step 1008 also whether the current detected by the low side current sensors 106 of the activated current generators 12 is substantially zero. In this case, the control unit 34 may set the state of the activated current generator 12 to a third state, which indicates that an open-load condition has been detected for the activated current generator 12.

The above procedure shows only schematically an embodiment of the steps used to verify the feedback signals FB. From a practical point of view, it is usually unlikely that the feedback signals FB provide immediately feasible data once the current generator 12 is activated, e.g., because usually a given time is required until the output current $i_{out}$ increases from zero. Accordingly, in FIG. 9 is shown an additional wait step 1004, in which the control unit 34 waits that a given (non-zero) time has lapsed since the activation of the current generator 12 at the step 1002.

However, the above solution has the disadvantage that it may be rather difficult to select the correct wait time for the step 1004, e.g., because the switch on time of the current generator depends usually also on the output load, rendering the switch-on time variable. Accordingly, the selected time may be too short in order to reliably detect a cross-wiring condition or too long, which may result in an excessive current provided to the lighting modules.

Figure 10:
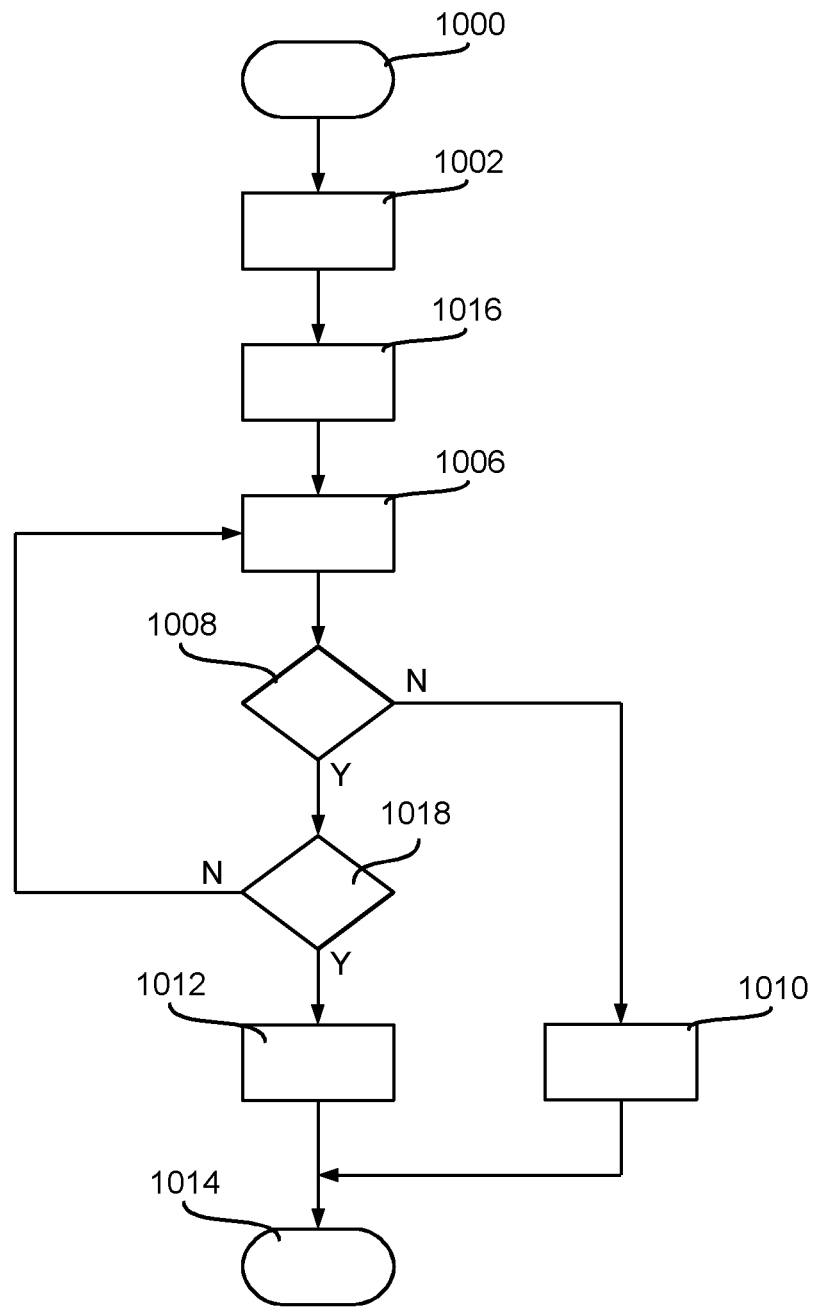

Accordingly, FIG. 10 shows an embodiment, in which an adaptive approach is used.

Specifically, instead of using a fixed wait time, a counter or timer is set at a step 1016 (between the steps 1002 and 1004). Moreover, when no cross-wiring has been detected at the step 1008, the procedure does not proceed immediately to the step 1012, but to a further verification step 1018. Specifically, the control unit 34 may verify/test at the step 1018 (based on the value of the counter/timer) whether a given maximum time $T_{max}$ has been reached.

In case the verification indicates that the given maximum time has not been reached (output "N" of the verification step 1018), the control unit 34 returns to the step 1006.

Conversely, in case the verification indicates that the given maximum time has been reached (output "Y" of the verification step 1018), the control unit 34 proceeds to the step 1012.

Accordingly, in the embodiment considered, the control unit 34 repeats the step 1008 until:
  a cross-wiring condition has been detected; or
  the maximum time $T_{max}$ has passed.

Figure 11:
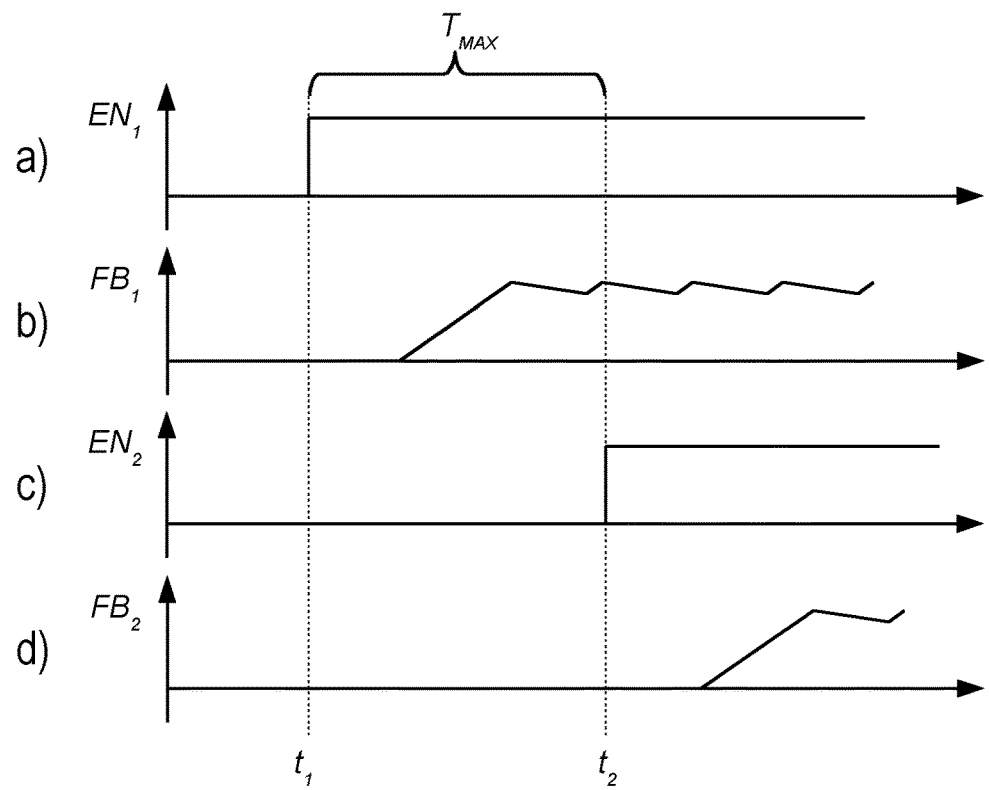
Figure 12:
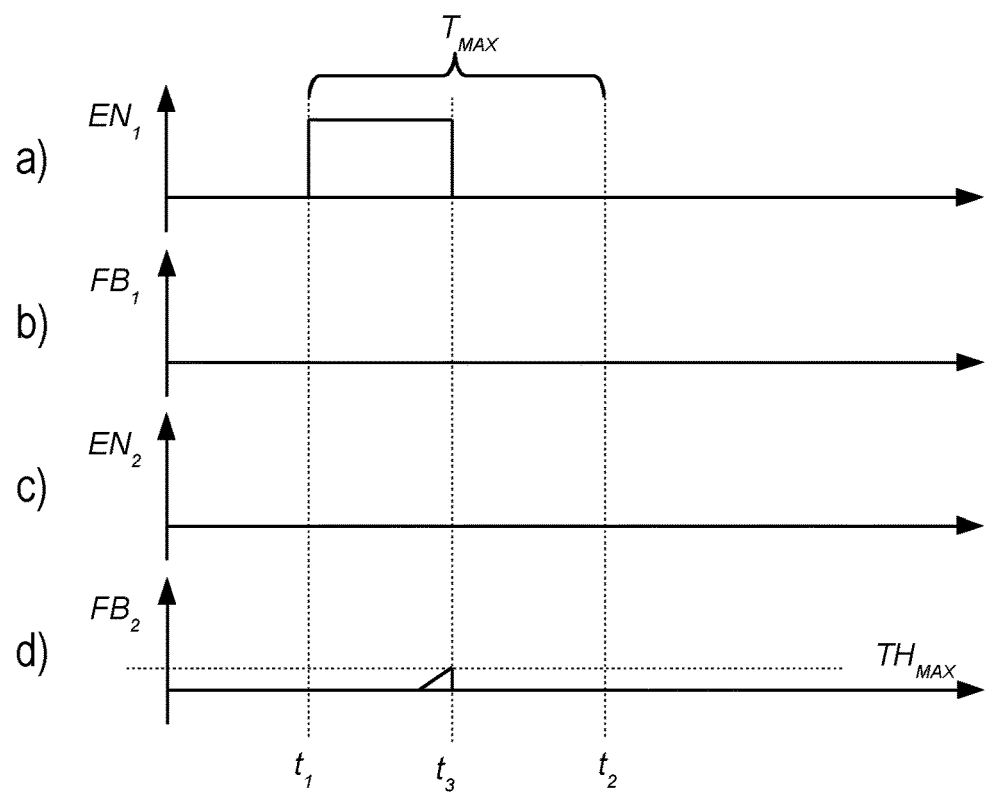

FIGS. 11 and 12 show in this respect possible waveforms for:
  a) the enable signal $EN_1$ for the first current generator $12_1$;
  b) the feedback signal $FB_1$ of the first current generator $12_1$;
  c) the enable signal $EN_2$ for the second current generator $12_2$; and
  d) the feedback signal $FB_2$ of the second current generator $12_2$.

Specifically, FIG. 11 shows possible waveforms when a correct wiring is used (i.e., one or more lighting modules 20 are connected between the terminals $102a_1$ and $102b_1$ of the current generator $12_1$, see also FIG. 6) and FIG. 12 shows possible waveforms when an incorrect/cross-wiring wiring is used (i.e., one or more lighting modules 20 are connected between the terminal $102a_1$ of the current generator $12_1$ and the terminal $102b_1$ of the current generator $12_2$, see also FIG. 7).

More specifically, in FIG. 11, the control unit 34 activates via the signal $EN_1$ the current generator $12_1$ at an instant $t_1$. Accordingly, the current $i_{out}$ generated by the current generator $12_1$ returns also to the terminal $102b$ of the current generator $12_1$, whereby the feedback signal $FB_1$ increase. Conversely, the control unit 34 maintains deactivated the current generator $12_2$ and the feedback signal $FB_2$ remains zero. Thus, in the embodiment considered, the control unit 34 continues to verify the feedback signals FB of the deactivated current generators (step 1008) until the maximum time $T_{max}$ has lapsed at an instant $t_2$.

The previous operations are then repeated for a next deactivated current generator 12. For example, the control unit 34 may activate via the signal $EN_2$ the current generator $12_2$ at the instant $t_2$ (or after a certain delay with respect to the instant $t_2$). In the embodiment considered, the control unit 34 maintains activated the already activated current generator $12_1$. Accordingly, the current $i_{out}$ generated by the current generator $12_2$ returns also to the terminal $102b$ of the current generator $12_2$, whereby the feedback signal $FB_2$ increase.

Conversely, in FIG. 12, the control unit 34 activates the current generator $12_1$ again at the instant $t_1$. However, in this case, the current $i_{out}$ generated by the current generator $12_1$ returns to the terminal $102b$ of the current generator $12_2$, whereby the feedback signal $FB_2$ indicates that the measure current increases, even though the control unit 34 maintains deactivated the current generator $12_2$. Accordingly, in the embodiment considered, the control unit 34 continues to verify the feedback signal $FB_2$ (step 1008) until a the current detected by the current sensor 106 of the current generator $12_2$ reaches/exceeds a maximum threshold $TH_{max}$ at an instant $t_3$ (as detected by means of digital processing or an analog comparator) Accordingly, in this case, the control unit 34 may deactivate via the signals EN all current generator 12 at the instant $t_3$ (step 1010).

Generally, the control unit 34 may also be implemented in an already existing control circuit of the power supply circuit 10. For example, in FIG. 13 is shown an embodiment, in which the control circuit 34 may implement in a control circuit performing also a dimming operation.

In this case, the control circuit 34 is configured to receive at input one or more control signals DIMM indicative of a requests luminosity and/or light color. For example, the one or more control signals DIMM may be received by at least one of:
  an additional terminal 100c of the power supply circuit 10,
  one or more sensors, such as ambient light sensors;
  one or more receivers, such as IR or radio receivers.

Accordingly, in the embodiment considered, the control circuit 34 generates one or more control signals for controlling the operation of the current generators 12 as a function of these one or more control signals DIMM.

For example, in various embodiments, the control circuit 34 may generate for this purpose for each current generate 12 one or more signal indicative of the requested current $i_{req}$ to be provided by the respective current generator 12, thereby implementing an AM (amplitude modulation) of the output current $i_{out}$. For example, the control circuit 34 may provide to each current generator 12 the reference signal REF or the threshold values $TH_L$ and/or $TH_H$ described in the foregoing.

Additionally or alternatively, the control circuit 34 may use the control signals EN (or possible additional control signals) for performing a PWM modulation of the output current $i_{out}$ provided by the respective current generators 12.

Of course, without prejudice to the underlying principle of the invention, the details and the embodiments may vary, even appreciably, with respect to what has been described by way of non-limiting example only, without departing from the extent of protection of the invention as defined by the annexed claims.

The invention claimed is:

1. A power supply circuit comprising:
  at least a first and a second current generator; and a positive and a negative terminal adapted to be connected to one or more lighting modules for each of the first and the second current generator;
  wherein each current generator is implemented with an electronic converter comprising:
  a switching stage comprising one or more electronic switches and one or more inductors, wherein the output of said switching stage is connected to the positive and negative terminal of the respective current generator;
  a low-side current sensor configured to generate a feedback signal indicative of the current received via the negative terminal of the respective current generator; and
  a regulator circuit configured to drive said one or more electronic switches of said switching stage as a function of the feedback signal of the respective current generator;
  wherein said power supply circuit comprises a control circuit configured for:
  activating said first current generator and maintaining deactivated said second current generator; monitoring the feedback signal of said second current generator while said first current generator is activated and said second current generator is deactivated;

verifying whether said feedback signal of said second current generator indicates that the current received via the negative terminal of the second current generator reaches or exceeds a given maximum threshold; and identifying said first current generator with a state indicating a cross-wiring condition and deactivating said first current generator when said verification indicates that the current received via the negative terminal of the second current generator reaches or exceeds said given maximum threshold.

2. The power supply circuit according to claim 1, wherein said control circuit is configured for:

activating said second current generator when said verification indicates that the current received via the negative terminal of the second current generator does not reach or exceed said given maximum threshold.

3. The power supply circuit according to claim 1, wherein said control circuit is configured for:

repeating the verifying whether said feedback signal of said second current generator indicates that the current received via the negative terminal of the second current generator reaches or exceeds a given maximum threshold until:

said verification indicates that the current received via the negative terminal of the second current generator reaches or exceeds said given maximum threshold; or a given maximum time has lapsed since the activation of said first current generator.

4. The power supply circuit according to claim 1, wherein said control circuit is configured for:

receiving one or more control signals indicative of a requested luminosity and/or light color; and generating one or more control signals in order to perform an amplitude modulation and/or pulse width modulation of the currents generated by said first and said second current generators.

5. The power supply circuit according to claim 1, comprising:

two input terminals for receiving an input voltage; and wherein said power supply circuit is configured to power said first and said second current generator via said input voltage.

6. The power supply circuit according to claim 5, wherein said input voltage is an AC voltage and said power supply circuit comprises a rectifier circuit connected between said two input terminals and said first and said second current generator.

7. The power supply circuit according to claim 5, comprising an additional electronic converter connected between said two input terminals and said first and said second current generator.

8. The power supply circuit according to claim 1, wherein said switching stage is a buck converter.

9. The power supply circuit according to claim 1, wherein said low-side current sensor is a low-side shunt resistor.

10. A lighting system comprising a power supply circuit according to claim 1 and at least one lighting module.

11. A method of operating a power supply circuit according to claim 1; wherein the method comprises:

activating said first current generator and maintaining deactivated said second current generator;

monitoring the feedback signal of at least of said second current generator while said first current generator ($12_1$) is activated and said second current generator ($12_2$) is deactivated;

verifying whether said feedback signal of said second current generator indicates that the current received via the negative terminal of the second current generator reaches or exceeds a given maximum threshold; and identifying said first current generator with a first state indicating a cross-wiring condition and deactivating said first current generator in case said verification indicates that the current received via the negative terminal of the second current generator reaches or exceeds said given maximum threshold.

\* \* \* \* \*